(12) United States Patent
Nguyen et al.

(10) Patent No.: US 9,129,796 B2
(45) Date of Patent: Sep. 8, 2015

(54) PRE-METAL DEPOSITION CLEAN PROCESS

(75) Inventors: Scott Cuong Nguyen, Garland, TX (US); Phuong-Lan Thi Tran, Las Colinas, TX (US); Michelle Marie Eastlack, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 961 days.

(21) Appl. No.: 13/211,095

(22) Filed: Aug. 16, 2011

(65) Prior Publication Data

US 2012/0058614 A1    Mar. 8, 2012

Related U.S. Application Data

(60) Provisional application No. 61/375,151, filed on Aug. 19, 2010.

(51) Int. Cl.
*H01L 21/336* (2006.01)
*H01L 21/02* (2006.01)
*H01L 21/285* (2006.01)
*H01L 29/788* (2006.01)
*H01L 29/66* (2006.01)

(52) U.S. Cl.
CPC ...... *H01L 21/0206* (2013.01); *H01L 21/28518* (2013.01); *H01L 29/7881* (2013.01); *H01L 29/665* (2013.01)

(58) Field of Classification Search
CPC ............... H01L 21/31111; H01L 21/67057; H01L 21/32134; H01L 21/02052; H01L 21/02054; H01L 21/02057; H01L 21/28518; H01L 29/665
USPC ................. 438/585, 694, 699, 704
See application file for complete search history.

(56) References Cited

U.S. PATENT DOCUMENTS

| | | | | | |
|---|---|---|---|---|---|
| 4,661,374 | A | * | 4/1987 | Doering | 438/303 |
| 4,900,257 | A | * | 2/1990 | Maeda | 438/532 |
| 2004/0127053 | A1 | * | 7/2004 | Wofford et al. | 438/704 |
| 2008/0164531 | A1 | * | 7/2008 | Jawarani et al. | 257/369 |

* cited by examiner

*Primary Examiner* — Zandra Smith
*Assistant Examiner* — John M Parker
(74) *Attorney, Agent, or Firm* — Jacqueline J. Garner; Frank D. Cimino (57) ABSTRACT

A process of forming an integrated circuit including an MOS transistor, in which a pre-metal deposition cleanup prior to depositing metal for silicide formation includes an HF etch, a first SC1 etch, a piranha etch and a second SC1 etch, so that a native oxide on the source/drain regions is less the 2 nanometers thick before deposition of the silicide metal. A process of forming a metal silicide layer on an integrated circuit containing an MOS transistor, in which a pre-metal deposition cleanup prior to depositing metal for silicide formation includes an HF etch, a first SC1 etch, a piranha etch and a second SC1 etch, so that a native oxide on the source/drain regions and the MOS gate is less the 2 nanometers thick before deposition of the silicide metal.

20 Claims, 7 Drawing Sheets

PRE-METAL DEPOSITION CLEAN PROCESS

FIELD OF THE INVENTION

This invention relates to the field of integrated circuits. More particularly, this invention relates to processes for fabricating integrated circuits.

BACKGROUND OF THE INVENTION

Fabrication of an integrated circuit may include formation of a layer of metal silicide at a top surface of a semiconductor substrate of the integrated circuit. The metal silicide layer may be formed by depositing a layer of metal on the top surface of the semiconductor substrate, followed by heating the integrated circuit to react the metal with exposed semiconductor material to form metal silicide. Oxide on the substrate surface during the metal deposition may impede formation of the metal silicide. The oxide may be removed by exposing the integrated circuit to an aqueous solution of hydrofluoric acid (HF) prior to the metal deposition. Exposure to HF may produce a hydrophobic condition at the existing top surface of the integrated circuit, which may disadvantageously induce accumulation of particles and other contamination on the top surface of the integrated circuit, possibly causing defects in the completed integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed using an improved pre-metal deposition cleanup prior to forming a metal layer for the purpose of forming metal silicide. The improved pre-metal deposition cleanup includes a hydrofluoric (commonly known as HF) acid etch to remove oxide from a top surface of the integrated circuit, exposure to a first aqueous solution of ammonium hydroxide and hydrogen peroxide (commonly known as SC1) to remove particles from the top surface, exposure to a mixture of sulfuric acid and hydrogen peroxide (commonly known as SPM or piranha) to remove organic residue from the top surface, followed by exposure to a second SC1 solution to provide a hydrophilic condition at the top surface of the integrated circuit. Following the improved pre-metal deposition cleanup, a metal layer is formed on the top surface, and the integrated circuit is heated to react the metal with exposed semiconductor material in active areas and/or gates of the integrated circuit to form metal silicide layers.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "integrated circuit" is understood to mean a monolithic semiconductor device containing transistors and possibly other components, at any stage of fabrication.

An integrated circuit may be formed using an improved pre-metal deposition cleanup prior to forming a metal layer for the purpose of forming metal silicide. The improved pre-metal deposition cleanup includes a hydrofluoric acid (commonly known as HF) etch to remove oxide from a top surface of the integrated circuit, exposure to a first aqueous solution of ammonium hydroxide and hydrogen peroxide (commonly known as SC1) to remove particles from the top surface, exposure to a mixture of sulfuric acid and hydrogen peroxide (commonly known as SPM or piranha) to remove organic residue from the top surface, followed by exposure to a second SC1 solution to provide a hydrophilic condition at the top surface of the integrated circuit. Following the improved pre-metal deposition cleanup, a metal layer is formed on the top surface, and the integrated circuit is heated to react the metal with exposed semiconductor material in active areas and/or gates of the integrated circuit to form metal silicide layers.

Figure 1A:
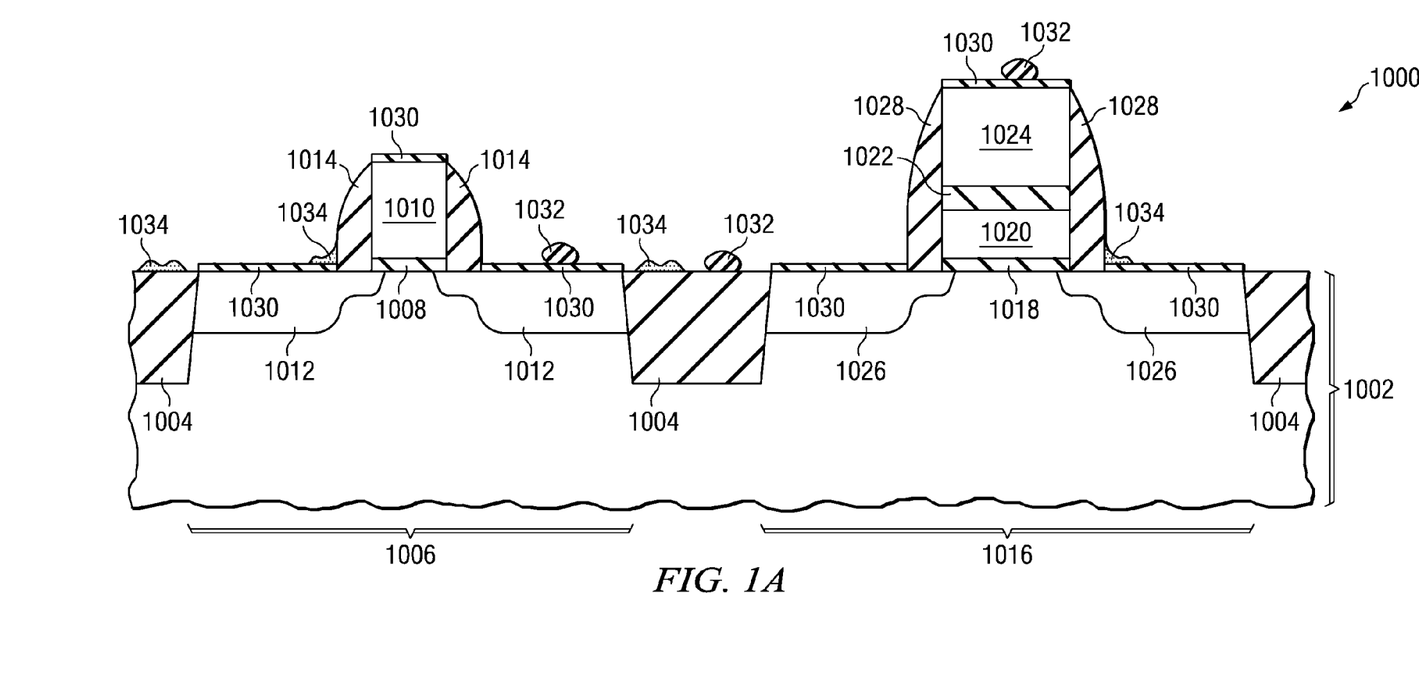
FIG. 1A through FIG. 1G are cross-sections of an integrated circuit during a pre-metal deposition cleanup and silicide formation process, according to an embodiment, depicted in successive stages of fabrication.

FIG. 1A through FIG. 1G are cross-sections of an integrated circuit during a pre-metal deposition cleanup and silicide formation process, according to an embodiment, depicted in successive stages of fabrication. Referring to FIG. 1A, the integrated circuit 1000 is formed in and on a semiconductor substrate 1002, which may be a single crystal silicon wafer, a silicon-on-insulator (SOI) wafer, a hybrid orientation technology (HOT) wafer with regions of different crystal orientations, or other material appropriate for fabrication of the integrated circuit 1000. Elements of field oxide 1004 may be formed at a top surface of the substrate 1002, for example of silicon dioxide between 250 and 600 nanometers thick, possibly by shallow trench isolation (STI) or local oxidation of silicon (LOCOS) processes. In STI processes, silicon dioxide may be deposited by high density plasma (HDP) or a high aspect ratio process (HARP).

The integrated circuit 1000 includes a metal oxide semiconductor (MOS) transistor 1006. The MOS transistor 1006 includes an MOS gate dielectric layer 1008 formed on a top surface of the substrate 1002. The MOS transistor 1006 further includes an MOS gate 1010 formed on a top surface of the MOS gate dielectric layer 1008. The MOS gate 1010 may include polycrystalline silicon, commonly known as polysilicon. The MOS transistor 1006 further includes MOS source/drain regions 1012 formed in the substrate 1002 adjacent to the MOS gate 1010. The MOS source/drain regions 1012 may include silicon-germanium (SiGe) or other semiconductor material. MOS sidewall spacers 1014 are formed on lateral surfaces of the MOS gate 1010. The MOS sidewall spacers 1014 may include silicon nitride and/or silicon dioxide.

The integrated circuit 1000 may also include a non-volatile memory transistor 1016 also known as a flash transistor 1016. The flash transistor 1016 if present includes a tunnel gate dielectric layer 1018 formed on the top surface of the substrate 1002, a floating gate 1020 formed on a top surface of the tunnel gate dielectric layer 1018, an interpoly dielectric layer 1022 formed on a top surface of the floating gate 1020 and a control gate 1024 formed on a top surface of the interpoly dielectric layer 1022. The control gate 1024 may include polysilicon. The flash transistor 1016 also includes flash source drain/regions 1026 formed in the substrate 1002 adjacent to the floating gate 1020, and flash sidewall spacers 1028 formed on lateral surfaces of the floating gate 1020, the interpoly dielectric layer 1022 and the control gate 1024. The flash source drain/regions 1026 may include silicon-germanium (SiGe) or other semiconductor material.

Oxide layers 1030 are present on top surfaces of the MOS source/drain regions 1012 and possibly on the MOS gate 1010. Oxide layers 1030 are also present on top surfaces of the flash source drain/regions 1026 and possibly on the control gate 1024, if present. It is desirable to remove the oxide layers 1030 prior to forming a metal layer on the integrated circuit 1000, because the oxide layers 1030 may interfere with subsequent formation of metal silicide layers. Particles 1032 of contaminate material may be present on an existing top surface of the integrated circuit 1000. It is desirable to remove the particles 1032 prior to forming the metal layer on the integrated circuit 1000 because the particles may interfere with the formation of the metal silicide layers. Organic residue 1034 may also be present on the existing top surface of the integrated circuit 1000. It is desirable to remove the organic residue 1034 prior to forming the metal layer on the integrated circuit 1000 because the particles may interfere with the formation of the metal silicide layers.

Figure 1B:
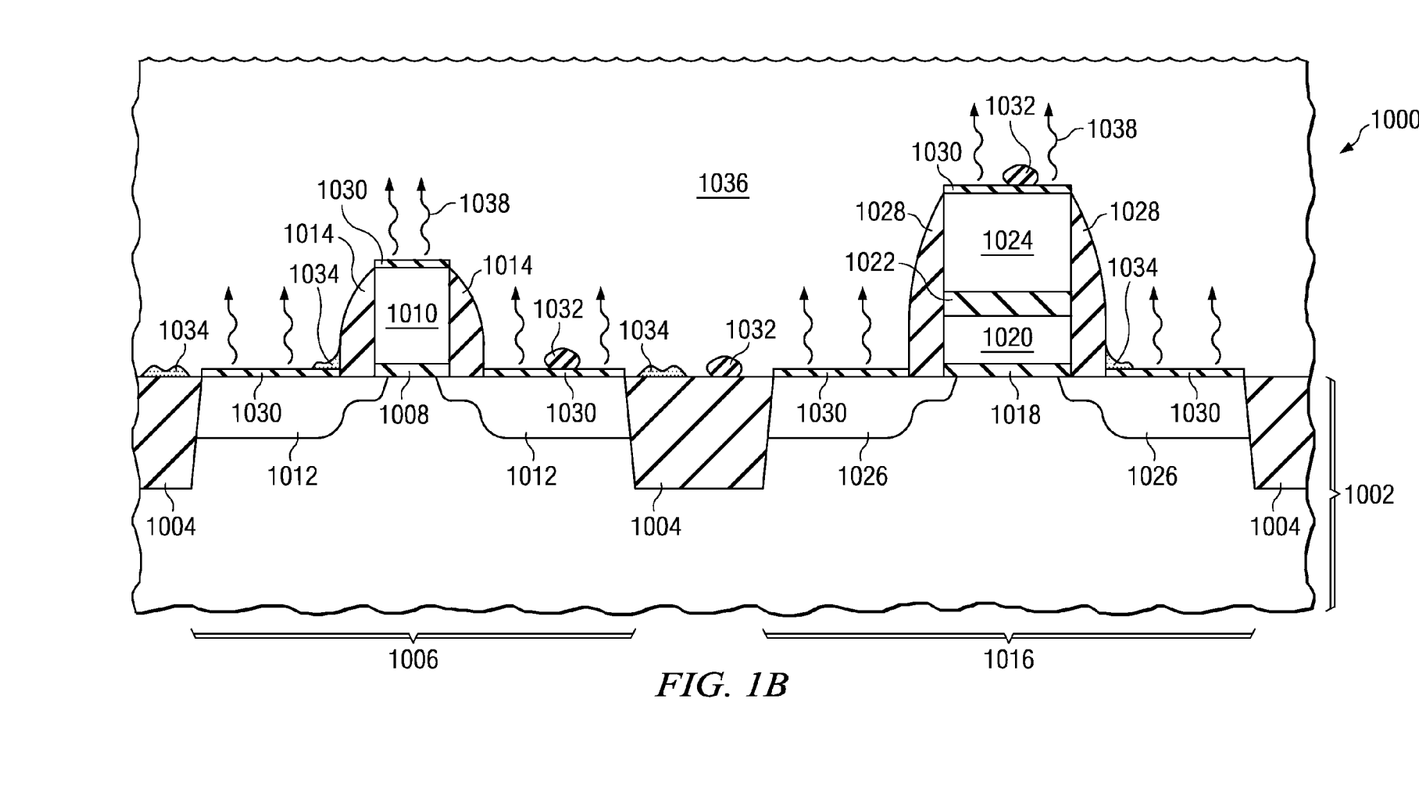

FIG. 1B depicts the integrated circuit 1000 during an HF etch process, in which the existing top surface of the integrated circuit 1000 is exposed to an aqueous HF solution 1036, depicted schematically in FIG. 1B as HF fluid 1036, for example in a wet etch hood. It is within the scope of the instant embodiment to perform the HF etch process by other means. The oxide layers 1030 are etched by the aqueous HF solution 1036 as depicted schematically in FIG. 1B by oxide dissolution arrows 1038. In one realization of the instant embodiment, the aqueous HF solution 1036 may have a concentration between 0.4 and 1.0 percent, the aqueous HF solution 1036 may be at a temperature between 20 and 30° C., and the integrated circuit 1000 may be exposed to the aqueous HF solution 1036 between 90 and 150 seconds.

Figure 1C:
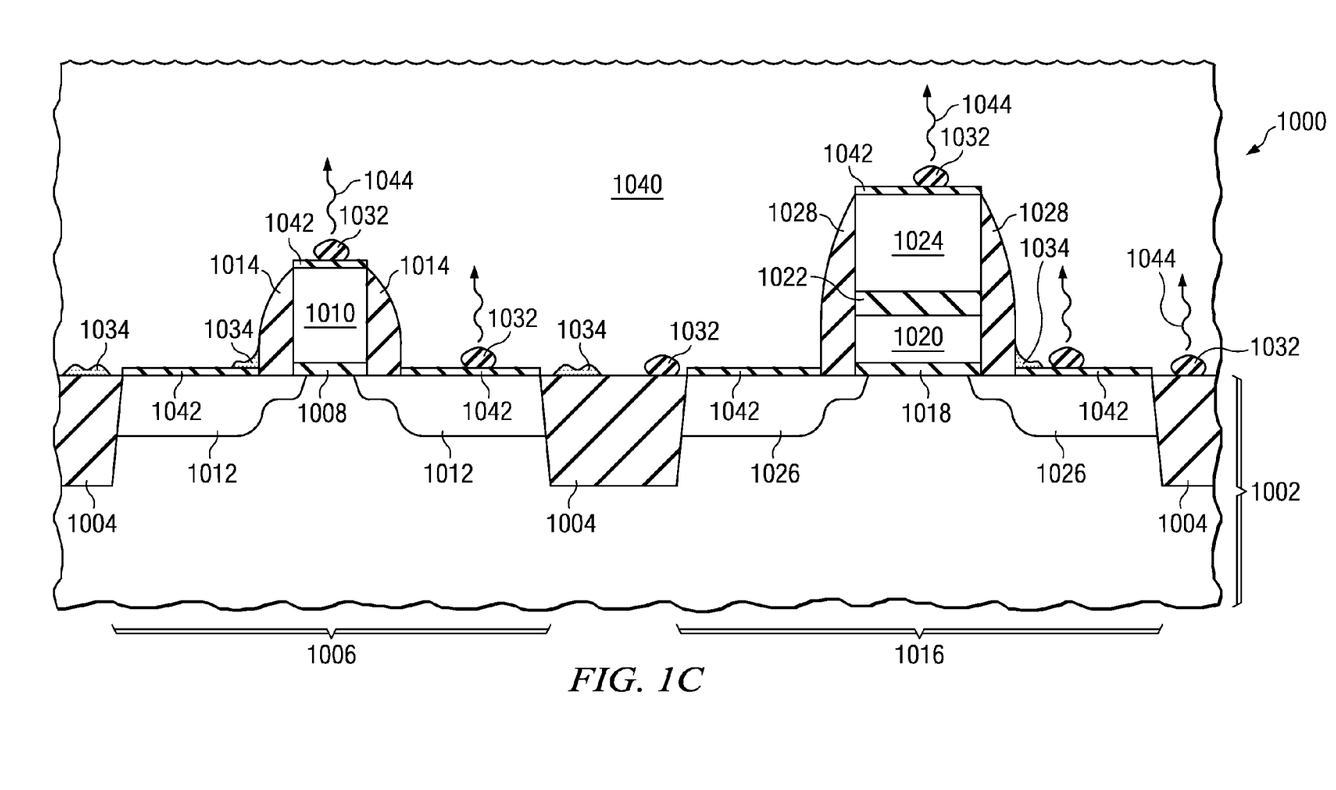

FIG. 1C depicts the integrated circuit 1000 during a first SC1 etch process, performed subsequent to the HF etch depicted in FIG. 1B, in which the existing top surface of the integrated circuit 1000 is exposed to a first aqueous solution of ammonium hydroxide and hydrogen peroxide 1040, depicted schematically in FIG. 1C as first SC1 fluid 1040. The existing top surface of the integrated circuit 1000 may be hydrophobic after the HF etch depicted in FIG. 1B, which may result in additional particles 1032 to be present on the top surface during subsequent steps. Subsequent to the HF etch, for example during a rinse operation or exposure to air, native oxide layers 1042 may be formed on exposed semiconductor surfaces of the integrated circuit 1000.

In one realization of the instant embodiment, the first SC1 etch 1040 may include between 3.5 and 6.5 percent ammonium hydroxide and between 3.5 and 6.5 percent hydrogen peroxide, the first SC1 etch 1040 may be at a temperature between 30 and 60° C., and the integrated circuit 1000 may be exposed to the first SC1 etch 1040 between 300 and 900 seconds. In one realization, the integrated circuit 1000 may be immersed in a bath of the first SC1 etch 1040, for example in a wet etch hood. It is within the scope of the instant embodiment to perform the first SC1 etch process by other means. In an alternate realization, the first SC1 etch 1040 may be sprayed onto the existing top surface of the integrated circuit 1000, for example in a Mercury model spray etch tool manufactured by FSI. It is within the scope of the instant embodiment to perform the first SC1 etch process by other means. Some or all of the particles 1032 are advantageously removed by the first SC1 etch 1040 as depicted schematically in FIG. 1C by particle removal arrows 1044.

Figure 1D:
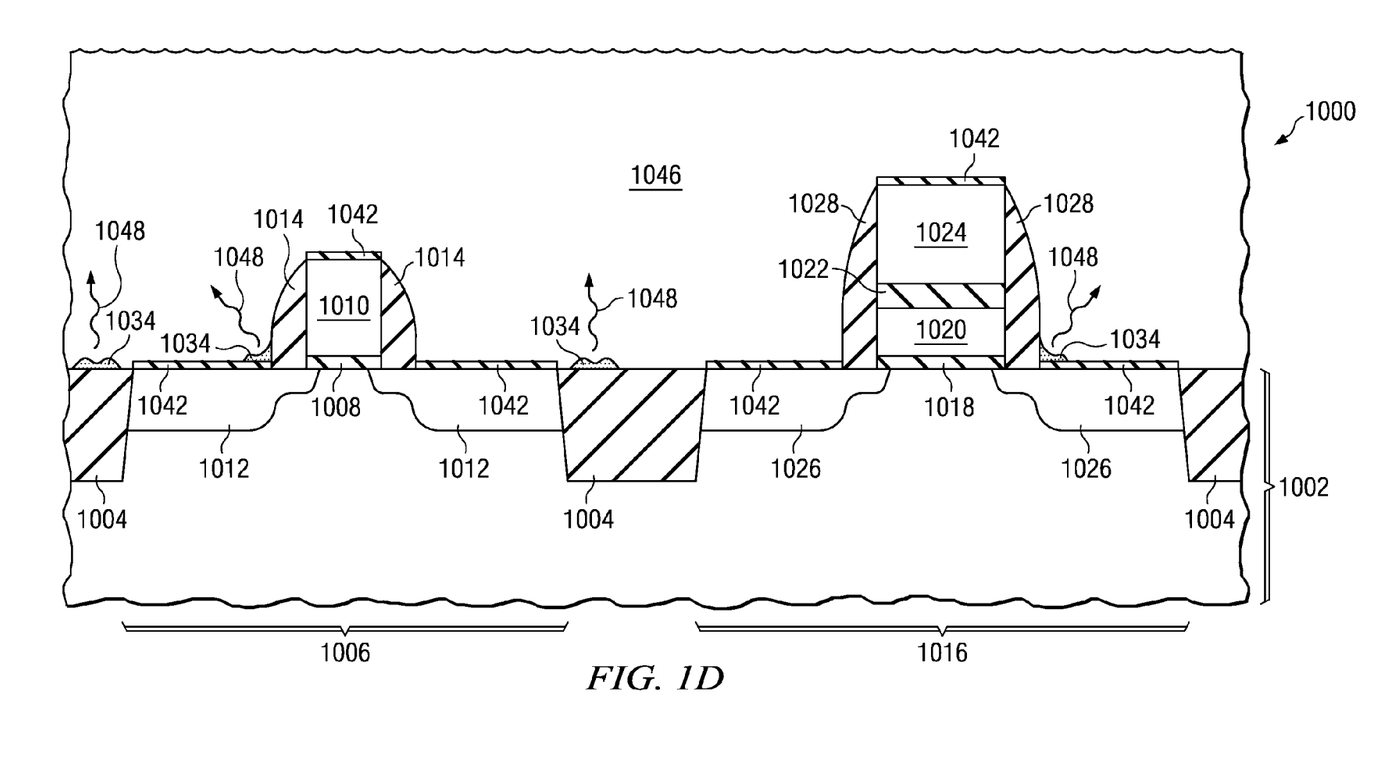

FIG. 1D depicts the integrated circuit 1000 during a piranha etch process, performed subsequent to the first SC1 etch depicted in FIG. 1C, in which the existing top surface of the integrated circuit 1000 is exposed to a mixture of sulfuric acid and 30% hydrogen peroxide 1046, depicted schematically in FIG. 1D as piranha fluid 1046. In one realization of the instant embodiment, a concentration of sulfuric acid in the piranha etch 1046 may be between 80 and 90 percent, the piranha etch 1046 may be at a temperature between 70 and 100° C., and the integrated circuit 1000 may be exposed to the piranha etch 1046 between 7 and 20 minutes. In one realization of the instant embodiment, the integrated circuit 1000 may be immersed in the piranha etch 1046, for example in a wet etch hood. In an alternate realization, the existing top surface of the integrated circuit 1000 may be exposed to a spray containing the piranha etch 1046, for example in an FSI Mercury spray etch tool. It is within the scope of the instant embodiment to perform the piranha etch process by other means. Some or all of the organic residue 1034 is advantageously removed by the piranha etch 1046 as depicted schematically in FIG. 1D by residue removal arrows 1048.

Figure 1E:
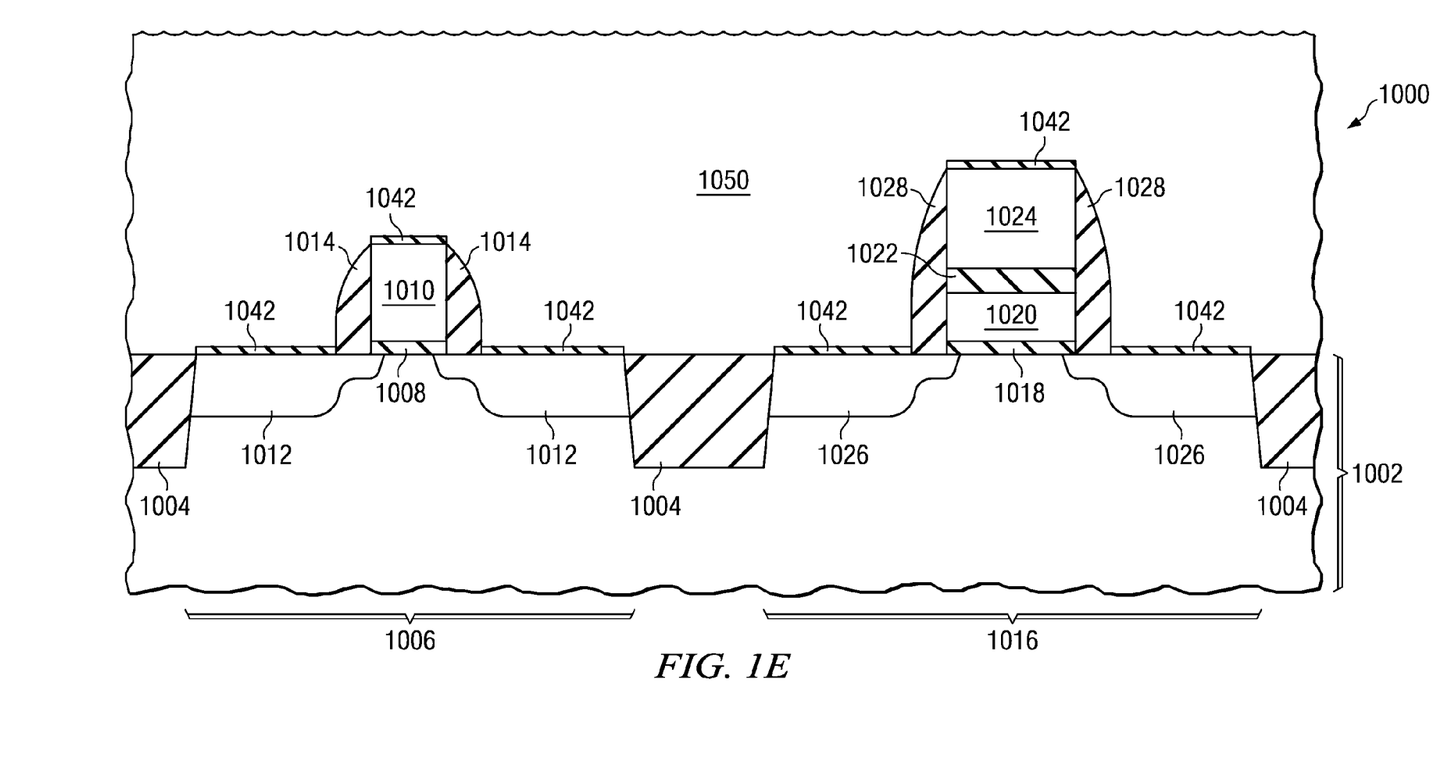

FIG. 1E depicts the integrated circuit 1000 during a second SC1 etch process depicted schematically in FIG. 1E as second SC1 fluid 1050, performed subsequent to the piranha etch depicted in FIG. 1D. The second SC1 etch 1050 is a second aqueous solution of ammonium hydroxide and hydrogen peroxide. In one realization of the instant embodiment, the second SC1 etch 1050 may include between 3.5 and 6.5 percent ammonium hydroxide and between 3.5 and 6.5 percent hydrogen peroxide. In a further realization, the concentrations of ammonium hydroxide and hydrogen peroxide in the second SC1 etch 1050 may be substantially equal to the concentrations of ammonium hydroxide and hydrogen peroxide used in the first SC1 etch process. In one realization, the second SC1 etch 1050 may be at a temperature between 25 and 80° C., and the integrated circuit 1000 may be exposed to the second SC1 etch 1050 between 100 and 400 seconds. In one realization, the integrated circuit 1000 may be immersed in the second SC1 etch 1050, for example in a wet etch hood. In an alternate realization, the existing top surface of the integrated circuit 1000 may be exposed to a spray containing the second SC1 etch 1050, for example in an FSI Mercury spray etch tool. It is within the scope of the instant embodiment to perform the second SC1 etch process by other means. After the second SC1 etch process is completed, the native oxide layers 1042 are less than 2 nanometers thick. Performing the second SC1 etch process may provide a hydrophilic condition at the existing top surface of the integrated circuit 1000, which may advantageously reduce particle accumulation on the integrated circuit 1000.

Figure 1F:
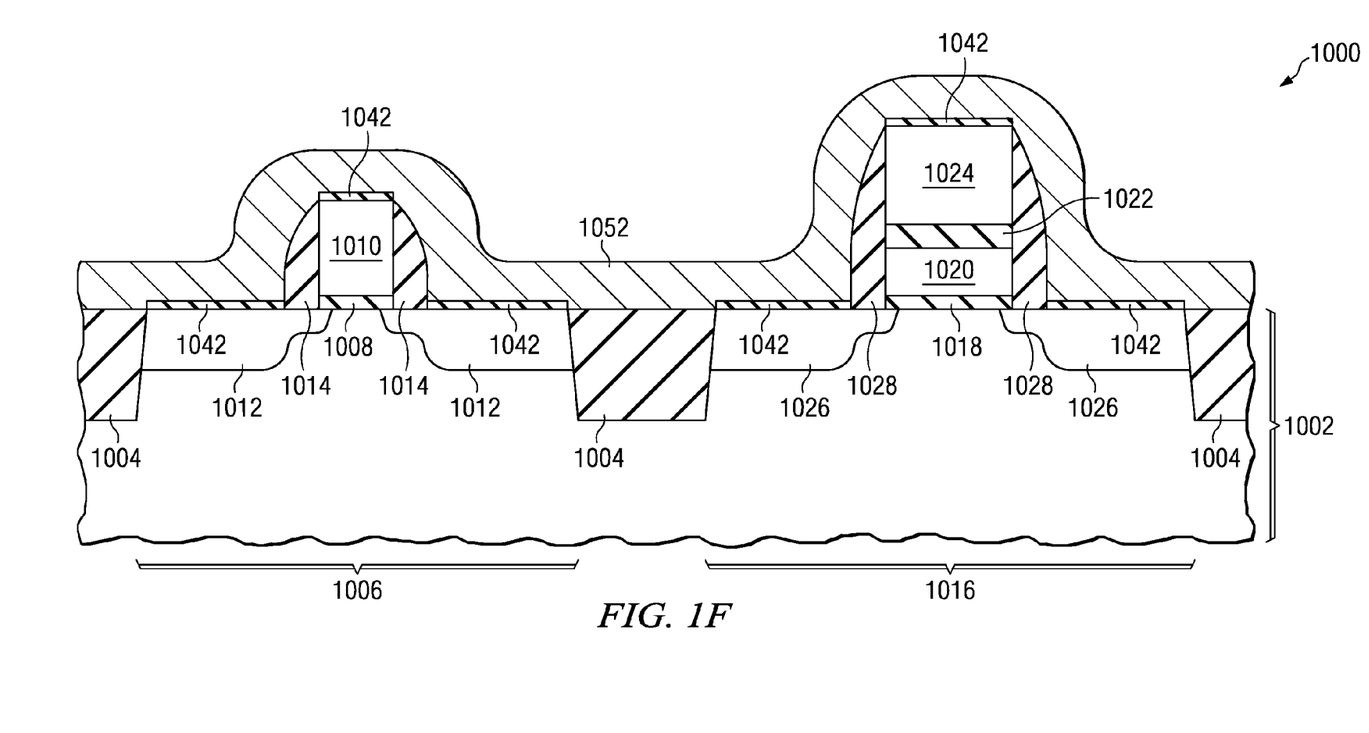

FIG. 1F depicts the integrated circuit 1000 after formation of a metal layer 1052 on an existing top surface of the integrated circuit. The native oxide layers 1042 may be partially or completely removed prior to formation of the metal layer 1052, for example by a sputter etch process. The metal layer 1052 contains at least 50 percent of one or more metal elements such as titanium, platinum, cobalt or nickel which will be subsequently reacted with exposed semiconductor material to form metal silicide at an interface between the metal layer 1052 and the exposed semiconductor material. In some realizations of the instant embodiment, the metal layer 1052 may be between 10 and 100 nanometers thick. In some realizations, a cap layer may be formed over the metal layer 1052 to enhance metal silicide formation.

Figure 1G:
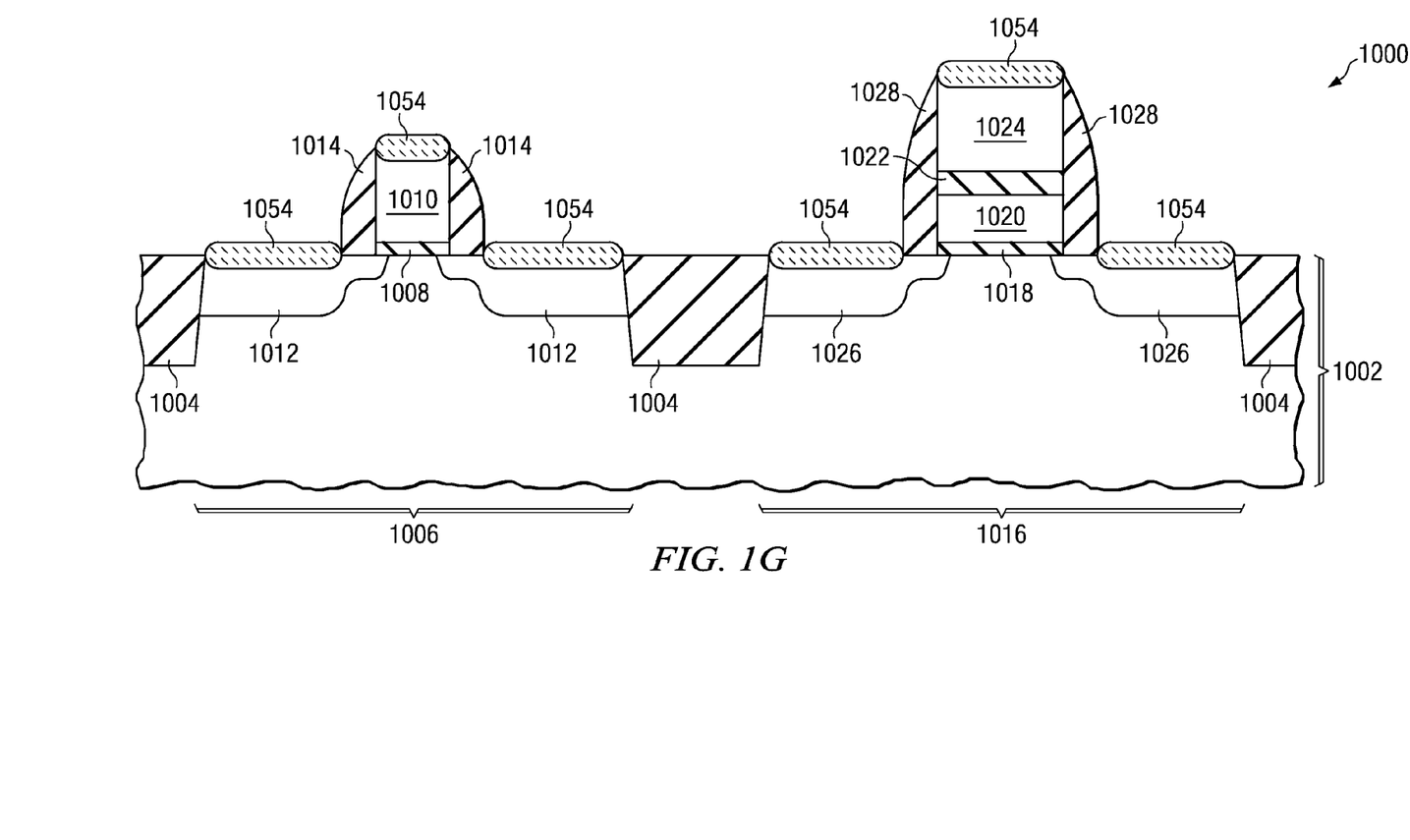

FIG. 1G depicts the integrated circuit 1000 after formation of metal silicide layers 1054 on the top surfaces of the MOS source/drain regions 1012 and the MOS gate 1010, and on the top surfaces of the flash source drain/regions 1026 and the control gate 1024, if present, by heating the integrated circuit 1000 with the metal layer 1052 depicted in FIG. 1F. Unreacted metal is subsequently removed from over the integrated circuit 1000, for example by exposing the integrated circuit 1000 to a wet etch containing sulfuric acid and hydrogen peroxide. Performing the pre-metal deposition cleanup as described in reference to FIG. 1B through FIG. 1E may provide reduced defects in the metal silicide layers 1054 compared to fabrication sequences which do not include a first SC1 etch process, piranha etch process and second SC1 etch process.

While various embodiments of the present invention have been described above, it should be understood that they have been presented by way of example only and not limitation. Numerous changes to the disclosed embodiments can be made in accordance with the disclosure herein without departing from the spirit or scope of the invention. For example, silicide could be formed on the source/drain regions, but not on the gate. In addition, the gate could be formed from metal, instead of polysilicon. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising:
providing a semiconductor substrate;
forming a metal oxide semiconductor (MOS) transistor in and on said substrate, by a process including:
  forming an MOS gate dielectric layer on a top surface of said substrate;
  forming an MOS gate on a top surface of said MOS gate dielectric layer;
  forming MOS source/drain regions in said substrate adjacent to said MOS gate, said MOS source/drain regions having oxide layers on a top surface;
  and forming MOS sidewall spacers on lateral surfaces of said MOS gate;
performing a cleanup process to prepare the top surface for the formation of silicide by:
  performing a hydrofluoric acid (HF) etch process, by a process which includes exposing an existing top surface of said integrated circuit to an aqueous HF solution, so that a portion or all of said oxide layers on said MOS source/drain regions are removed;
  performing a first SC1 etch process, by a process which includes exposing said existing top surface of said integrated circuit to a first aqueous solution of ammonium hydroxide and hydrogen peroxide;
  performing a piranha process, by a process which includes exposing said existing top surface of said integrated circuit to a mixture including sulfuric acid and hydrogen peroxide; and
  performing a second SC1 etch process, by a process which includes exposing said existing top surface of said integrated circuit to a second aqueous solution of ammonium hydroxide and hydrogen peroxide, so that native oxide layers on said top surface of said MOS source/drain regions are less than 2 nanometers thick;
after performing the cleanup process, forming a metal layer on said existing top surface of said integrated circuit;
heating said integrated circuit so as to react metal in said metal layer with semiconductor material at said top surface of said MOS source/drain regions to form metal silicide layers at an interface between said metal layer and said MOS source/drain regions; and
removing unreacted metal from over said integrated circuit.

2. The process of claim 1, in which:
a concentration of ammonium hydroxide in said first aqueous solution of ammonium hydroxide and hydrogen peroxide is between 3.5 and 6.5 percent; and
a concentration of hydrogen peroxide in said first aqueous solution of ammonium hydroxide and hydrogen peroxide is between 3.5 and 6.5 percent.

3. The process of claim 1, in which:
a temperature of said first aqueous solution of ammonium hydroxide and hydrogen peroxide is between 30 and 60° C.; and
said integrated circuit may be exposed to said first aqueous solution of ammonium hydroxide and hydrogen peroxide between 300 and 900 seconds.

4. The process of claim 1, in which a concentration of sulfuric acid in said mixture including sulfuric acid and hydrogen peroxide is between 80 and 90 percent.

5. The process of claim 1, in which:
a temperature of said mixture including sulfuric acid and hydrogen peroxide is between 70 and 100° C.; and
said integrated circuit may be exposed to said mixture including sulfuric acid and hydrogen peroxide between 7 and 20 minutes.

6. The process of claim 1, in which:
a concentration of ammonium hydroxide in said second aqueous solution of ammonium hydroxide and hydrogen peroxide is between 3.5 and 6.5 percent;
a concentration of hydrogen peroxide in said second aqueous solution of ammonium hydroxide and hydrogen peroxide is between 3.5 and 6.5 percent;
a temperature of said second aqueous solution of ammonium hydroxide and hydrogen peroxide is between 25 and 80° C.; and
said integrated circuit may be exposed to said second aqueous solution of ammonium hydroxide and hydrogen peroxide between 100 and 400 seconds.

7. The process of claim 1, in which said metal layer contains at least 50 percent of a metal selected from the group consisting of:
titanium,
platinum,
cobalt, and
nickel.

8. The process of claim 1, in which:
said MOS gate includes polysilicon;
an oxide layer is present on a top surface of said MOS gate;
said step of performing an HF etch process is performed so that a portion or all of said oxide layer on said MOS gate is removed;

said step of performing a second SC1 etch process is performed so that a native oxide layer on said top surface of MOS gate less than 2 nanometers thick; and said step of heating said integrated circuit causes metal in said metal layer to react with semiconductor material at said top surface of said MOS gate to form a metal silicide layer at an interface between said metal layer and said MOS gate.

9. The process of claim 1, further including forming a non-volatile memory transistor (flash transistor) in and on said substrate, by a process including:

forming a tunnel gate dielectric layer on a top surface of said substrate; forming a floating gate on a top surface of said tunnel gate dielectric layer;

forming an interpoly dielectric layer on a top surface of said floating gate;

forming a control gate on a top surface of said interpoly dielectric layer, said control gate including polysilicon, said control gate having an oxide layer on a top surface;

forming flash source/drain regions in said substrate adjacent to said floating gate, said flash source/drain regions having oxide layers on a top surface; and forming flash sidewall spacers on lateral surfaces of said floating gate, said interpoly dielectric layer and said control gate;

so that:

said step of performing an HF etch process is performed so that a portion or all of said oxide layers on said control gate and said flash source/drain regions are removed;

said step of performing a second SC1 etch process is performed so that native oxide layers on said top surface of said control gate and said top surface of said flash source/drain regions are less than 2 nanometers thick; and said step of heating said integrated circuit causes metal in said metal layer to react with semiconductor material at said top surface of said control gate and said top surface of said flash source/drain regions to form metal silicide layers at an interface between said metal layer and said control gate and said flash source/drain regions.

10. A process of forming a metal silicide layer on an integrated circuit, comprising:

providing a semiconductor substrate, an MOS gate dielectric layer on a top surface of said substrate, an MOS gate on a top surface of said MOS gate dielectric layer, said MOS gate having an oxide layer on a top surface, and MOS source/drain regions in said substrate adjacent to said MOS gate, said MOS source/drain regions having oxide layers on a top surface;

performing a cleanup process to prepare the top surface for the formation of silicide by:

performing an HF etch process, by a process which includes exposing an existing top surface of said integrated circuit to an aqueous HF solution, so that a portion or all of said oxide layers on said MOS gate and said MOS source/drain regions are removed;

performing a first SC1 etch process, by a process which includes exposing said existing top surface of said integrated circuit to a first aqueous solution of ammonium hydroxide and hydrogen peroxide;

performing a piranha process, by a process which includes exposing said existing top surface of said integrated circuit to a mixture including sulfuric acid and hydrogen peroxide; and performing a second SC1 etch process, by a process which includes exposing said existing top surface of said integrated circuit to a second aqueous solution of ammonium hydroxide and hydrogen peroxide, so that native oxide layers on said top surface of said MOS gate and said top surface of said MOS source/drain regions are less than 2 nanometers thick;

after performing the cleanup process, forming a metal layer on said existing top surface of said integrated circuit; and heating said integrated circuit so as to react metal in said metal layer with semiconductor material at said top surface of said MOS gate and said top surface of said MOS source/drain regions to form metal silicide layers at an interface between said metal layer and said MOS gate and said MOS source/drain regions.

11. The process of claim 10, in which:

a concentration of ammonium hydroxide in said first aqueous solution of ammonium hydroxide and hydrogen peroxide is between 3.5 and 6.5 percent; and a concentration of hydrogen peroxide in said first aqueous solution of ammonium hydroxide and hydrogen peroxide is between 3.5 and 6.5 percent.

12. The process of claim 10, in which a temperature of said first aqueous solution of ammonium hydroxide and hydrogen peroxide is between 30 and 60° C.

13. The process of claim 10, in which said integrated circuit may be exposed to said first aqueous solution of ammonium hydroxide and hydrogen peroxide between 300 and 900 seconds.

14. The process of claim 10, in which a concentration of sulfuric acid in said mixture including sulfuric acid and hydrogen peroxide is between 80 and 90 percent.

15. The process of claim 10, in which a temperature of said mixture including sulfuric acid and hydrogen peroxide is between 70 and 100° C.

16. The process of claim 10, in which said integrated circuit may be exposed to said mixture including sulfuric acid and hydrogen peroxide between 7 and 20 minutes.

17. The process of claim 10, in which:

a concentration of ammonium hydroxide in said second aqueous solution of ammonium hydroxide and hydrogen peroxide is between 3.5 and 6.5 percent; and a concentration of hydrogen peroxide in said second aqueous solution of ammonium hydroxide and hydrogen peroxide is between 3.5 and 6.5 percent.

18. The process of claim 10, in which a temperature of said second aqueous solution of ammonium hydroxide and hydrogen peroxide is between 25 and 80° C.

19. The process of claim 10, in which said integrated circuit may be exposed to said second aqueous solution of ammonium hydroxide and hydrogen peroxide between 100 and 400 seconds.

20. The process of claim 10, in which said metal layer contains at least 50 percent of a metal selected from the group consisting of:

titanium,
platinum,
cobalt, and
nickel.

* * * * *